(12) United States Patent
Desappan et al.

(10) Patent No.: US 9,154,158 B2
(45) Date of Patent: Oct. 6, 2015

(54) MACRO-BLOCK ENCODING OF SKIPPED VIDEO FRAMES

(75) Inventors: Kumar Arrakutti Desappan, Karnataka (IN); Pramod Kumar Swami, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 554 days.

(21) Appl. No.: 13/346,539

(22) Filed: Jan. 9, 2012

(65) Prior Publication Data

US 2012/0183058 A1 Jul. 19, 2012

(51) Int. Cl.
  *H04N 19/00* (2014.01)
  *H03M 7/40* (2006.01)
  *H04N 19/91* (2014.01)

(52) U.S. Cl.
  CPC .............. *H03M 7/4018* (2013.01); *H04N 19/91* (2014.11)

(58) Field of Classification Search
  CPC .. H04N 7/50; H04N 7/26244; H04N 7/26271
  USPC ..................................................... 375/240.12
  See application file for complete search history.

(56) References Cited

U.S. PATENT DOCUMENTS

| 2005/0047504 A1* | 3/2005 | Sung et al. ................. 375/240.2 |
| 2009/0010556 A1* | 1/2009 | Uchibayashi et al. ........ 382/239 |
| 2009/0190655 A1* | 7/2009 | Shimada et al. ......... 375/240.01 |
| 2011/0200115 A1* | 8/2011 | Hayashi et al. .......... 375/240.24 |

OTHER PUBLICATIONS

Malepati (Digital Media Processing, Malepati, May 26, 2010).*

* cited by examiner

*Primary Examiner* — Jay Patel
*Assistant Examiner* — Frank Huang
(74) *Attorney, Agent, or Firm* — Mima Abyad; Frank D. Cimino

(57) ABSTRACT

A video system includes an encoder for generating a compressed bit stream in response to a received video signal. A transitional location is located in the bit stream that includes skip macro-block encoding, where the transitional location provides an indication where a linear relationship starts to exist between a length of the encoded bit stream and a length of a number of skipped macro-blocks. The skipped macro-blocks in the bit stream before the transitional location are encoded using a predetermined nonlinear relationship between the length of the encoded bit stream and the length of the number of skipped macro-blocks, whereas skipped macro-blocks in the bit stream are encoded using a linear relationship between the length of the encoded bit stream and the length of the number of skipped macro-blocks.

19 Claims, 9 Drawing Sheets

FIG. 3A

| Slice Qp | P Picture |  |  |  |  |  | B Picture |  |  |  |  |  |
|---|---|---|---|---|---|---|---|---|---|---|---|---|
|  | cabac_init_idc |  |  |  |  |  | cabac_init_idc |  |  |  |  |  |
|  | 0 |  | 1 |  | 2 |  | 0 |  | 1 |  | 2 |  |
|  | m | n | m | n | m | n | m | n | m | n | m | n |
|  | 23 | 33 | 22 | 25 | 29 | 16 | 18 | 64 | 26 | 34 | 20 | 40 |
| 0 | 33 |  | 25 |  | 16 |  | 64 | 0 | 34 |  | 40 |  |
| 1 | 34 |  | 26 |  | 17 |  | 65 | 1 | 35 |  | 41 |  |
| 2 | 35 |  | 27 |  | 19 |  | 66 | 2 | 37 |  | 42 |  |
| 3 | 37 |  | 29 |  | 21 |  | 67 | 3 | 38 |  | 43 |  |
| 4 | 38 |  | 30 |  | 23 |  | 68 | 4 | 40 |  | 45 |  |
| 5 | 40 |  | 31 |  | 25 |  | 69 | 5 | 42 |  | 46 |  |
| 6 | 41 |  | 33 |  | 26 |  | 70 | 6 | 43 |  | 47 |  |
| 7 | 43 |  | 34 |  | 28 |  | 71 | 7 | 45 |  | 48 |  |
| 8 | 44 |  | 36 |  | 30 |  | 73 | 9 | 47 |  | 50 |  |
| 9 | 45 |  | 37 |  | 32 |  | 74 | 10 | 48 |  | 51 |  |
| 10 | 47 |  | 38 |  | 34 |  | 75 | 11 | 50 |  | 52 |  |
| 11 | 48 |  | 40 |  | 35 |  | 76 | 12 | 51 |  | 53 |  |
| 12 | 50 |  | 41 |  | 37 |  | 77 | 13 | 53 |  | 55 |  |
| 13 | 51 |  | 42 |  | 39 |  | 78 | 14 | 55 |  | 56 |  |
| 14 | 53 |  | 44 |  | 41 |  | 79 | 15 | 56 |  | 57 |  |
| 15 | 54 |  | 45 |  | 43 |  | 80 | 16 | 58 |  | 58 |  |
| 16 | 56 |  | 47 |  | 45 |  | 82 | 18 | 60 |  | 60 |  |
| 17 | 57 |  | 48 |  | 46 |  | 83 | 19 | 61 |  | 61 |  |
| 18 | 58 |  | 49 |  | 48 |  | 84 | 20 | 63 |  | 62 |  |
| 19 | 60 |  | 51 |  | 50 |  | 85 | 21 | 64 | 0 | 63 |  |
| 20 | 61 |  | 52 |  | 52 |  | 86 | 22 | 66 | 2 | 65 | 1 |
| 21 | 63 |  | 53 |  | 54 |  | 87 | 23 | 68 | 4 | 66 | 2 |
| 22 | 64 | 0 | 55 |  | 55 |  | 88 | 24 | 69 | 5 | 67 | 3 |

FROM FIG. 3A

| | | | | | | | | | | | |
|---|---|---|---|---|---|---|---|---|---|---|---|
| 23 | 66 | 2 | 56 | | 57 | | 89 | 25 | 71 | 7 | 68 | 4 |
| 24 | 67 | 3 | 58 | | 59 | | 91 | 27 | 73 | 9 | 70 | 6 |
| 25 | 68 | 4 | 59 | | 61 | | 92 | 28 | 74 | 10 | 71 | 7 |
| 26 | 70 | 6 | 60 | | 63 | | 93 | 29 | 76 | 12 | 72 | 8 |
| 27 | 71 | 7 | 62 | | 64 | 0 | 94 | 30 | 77 | 13 | 73 | 9 |
| 28 | 73 | 9 | 63 | | 66 | 2 | 95 | 31 | 79 | 15 | 75 | 11 |
| 29 | 74 | 10 | 64 | 0 | 68 | 4 | 96 | 32 | 81 | 17 | 76 | 12 |
| 30 | 76 | 12 | 66 | 2 | 70 | 6 | 97 | 33 | 82 | 18 | 77 | 13 |
| 31 | 77 | 13 | 67 | 3 | 72 | 8 | 98 | 34 | 84 | 20 | 78 | 14 |
| 32 | 79 | 15 | 69 | 5 | 74 | 10 | 100 | 36 | 86 | 22 | 80 | 16 |
| 33 | 80 | 16 | 70 | 6 | 75 | 11 | 101 | 37 | 87 | 23 | 81 | 17 |
| 34 | 81 | 17 | 71 | 7 | 77 | 13 | 102 | 38 | 89 | 25 | 82 | 18 |
| 35 | 83 | 19 | 73 | 9 | 79 | 15 | 103 | 39 | 90 | 26 | 83 | 19 |
| 36 | 84 | 20 | 74 | 10 | 81 | 17 | 104 | 40 | 92 | 28 | 85 | 21 |
| 37 | 86 | 22 | 75 | 11 | 83 | 19 | 105 | 41 | 94 | 30 | 86 | 22 |
| 38 | 87 | 23 | 77 | 13 | 84 | 20 | 106 | 42 | 95 | 31 | 87 | 23 |
| 39 | 89 | 25 | 78 | 14 | 86 | 22 | 107 | 43 | 97 | 33 | 88 | 24 |
| 40 | 90 | 26 | 80 | 16 | 88 | 24 | 109 | 45 | 99 | 35 | 90 | 26 |
| 41 | 91 | 27 | 81 | 17 | 90 | 26 | 110 | 46 | 100 | 36 | 91 | 27 |
| 42 | 93 | 29 | 82 | 18 | 92 | 28 | 111 | 47 | 102 | 38 | 92 | 28 |
| 43 | 94 | 30 | 84 | 20 | 93 | 29 | 112 | 48 | 103 | 39 | 93 | 29 |
| 44 | 96 | 32 | 85 | 21 | 95 | 31 | 113 | 49 | 105 | 41 | 95 | 31 |
| 45 | 97 | 33 | 86 | 22 | 97 | 33 | 114 | 50 | 107 | 43 | 96 | 32 |
| 46 | 99 | 35 | 88 | 24 | 99 | 35 | 115 | 51 | 108 | 44 | 97 | 33 |
| 47 | 100 | 36 | 89 | 25 | 101 | 37 | 116 | 52 | 110 | 46 | 98 | 34 |
| 48 | 102 | 38 | 91 | 27 | 103 | 39 | 118 | 54 | 112 | 48 | 100 | 36 |
| 49 | 103 | 39 | 92 | 28 | 104 | 40 | 119 | 55 | 113 | 49 | 101 | 37 |
| 50 | 104 | 40 | 93 | 29 | 106 | 42 | 120 | 56 | 115 | 51 | 102 | 38 |
| 51 | 106 | 42 | 95 | 31 | 108 | 44 | 121 | 57 | 116 | 52 | 103 | 39 |

350

MACRO-BLOCK ENCODING OF SKIPPED VIDEO FRAMES

CLAIM OF PRIORITY

This application for Patent claims priority to India Provisional Application No. 115.CHE/2011 entitled "Coding Picture with all Skip Macro-Blocks Using CABAC in H264 Encoder" filed Jan. 13, 2011, wherein the application listed above is incorporated by reference herein.

BACKGROUND

Video processing applications using video encoders often require frames to be skipped in order to maintain a constant bit rate. Some of the video processing applications use the technique of frame skipping in the encoder to maintain the constant bit rate. The technique of using skip frames often avoids the use of processor bandwidth during time of heavy bandwidth requirements (for example), which helps to reduce peak computing requirements and thus stay within the bounds of the total processing budget allotted for the video application.

The Institute of Electrical and Electronic Engineers (IEEE) H.264 standard is one of the most popular video compression standards, which is used in video recording/encoding applications. Conventional approaches in an H.264-compliant encoder to skip frames include skipping an entire frame and associated bit-stream and then convey this information through RTP (Real-time Transfer Protocol) time stamps or picture timing SEI (System Enhanced Information) messages. Likewise the encoder is required to inform the system of each such frame skip. When using conventional approaches, it is typically difficult to synchronize timing information between the encoder and the embodying system when frames are skipped. Further, decoders that receive a video stream from the encoder are not always able to read the picture timing SEI messages that inform the decoder of the frame skip. Thus, system implementation requirements are increased for integrating frame skips, whereas processing (and bandwidth) requirements are increased when each individual frame is encoded. Thus, it is often difficult to balance the two approaches of using frame skipping (to save generating bits and improve performance) and coding all frames (to simplify implementation requirements).

SUMMARY

The problems noted above are solved in large part by encoding the macro-blocks of a frame to be skipped as "skipped" macro-blocks. A video system includes an encoder for generating a compressed bit stream in response to a received video signal containing frames. A transitional location is located in the bit stream that includes skip macro-block encoding, where the transitional location provides an indication where a linear relationship starts to exist between a length of the encoded bit stream and a length of a number of skipped macro-blocks. The skipped macro-blocks in the bit stream before the transitional location are encoded using a predetermined nonlinear relationship between the length of the encoded bit stream and the length of the number of skipped macro-blocks, whereas skipped macro-blocks in the bit stream are encoded using a linear relationship between the length of the encoded bit stream and the length of the number of skipped macro-blocks.

Skipping macro-blocks for frame skipping, as disclosed herein, has reduced bandwidth and processing requirements as compared with conventional frame-skipping approaches. Processing power is reduced by use of a skip macro-block flag to avoid process-intensive portions of a macro-block-level processing loop. Skipping macro-blocks for frame skipping also avoids the unpaired field problem encountered by many decoders when processing interlaced video streams.

BRIEF DESCRIPTION OF THE DRAWINGS

FIG. 3 is a context table illustrating regions of values of a most probable symbol as a function of the calculated value of a state variable in accordance with embodiments of the present disclosure.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . " Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

Figure 1:
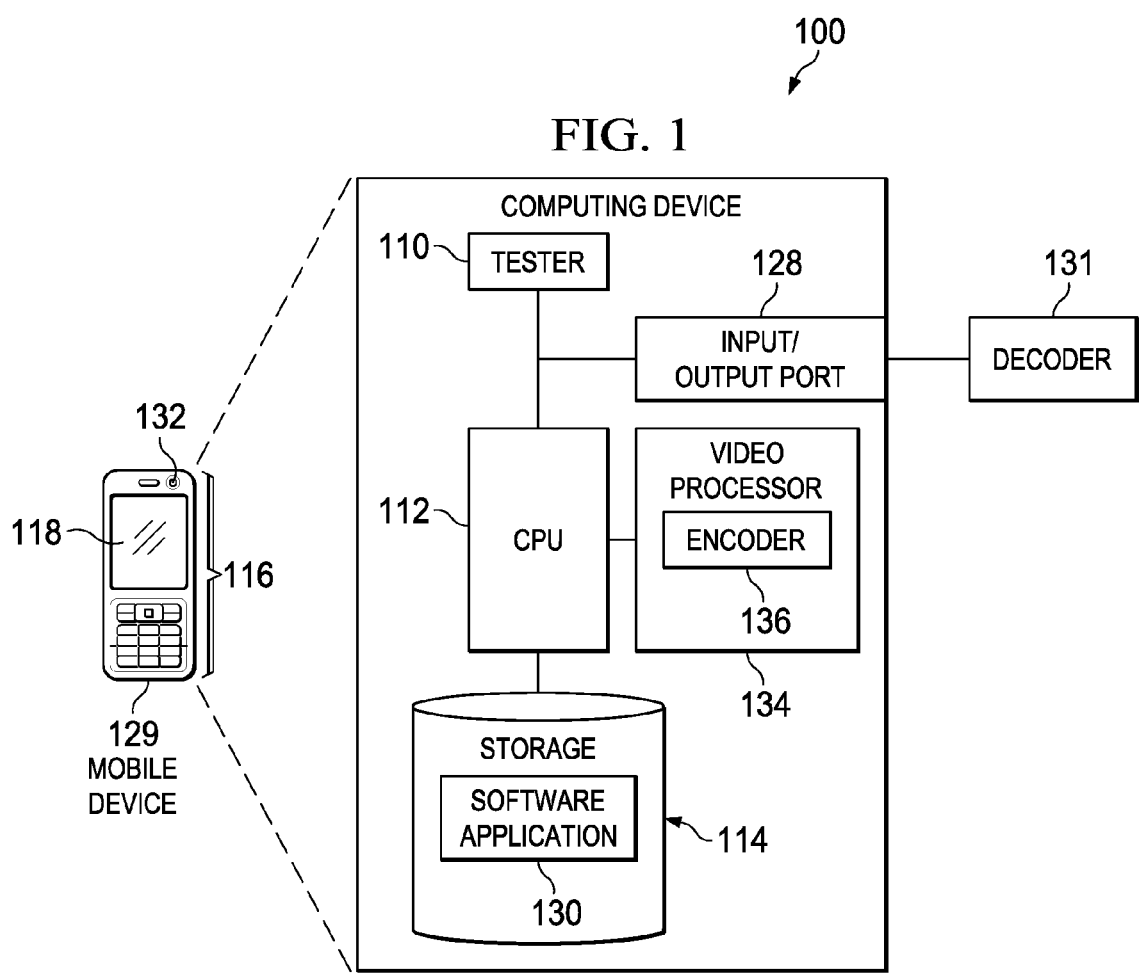
FIG. 1 shows an illustrative computing device 100 in accordance with embodiments of the disclosure.

FIG. 1 shows an illustrative computing device 100 in accordance with embodiments of the disclosure. For example, the computing device 100 is, or is incorporated into, a mobile device 129, such as a mobile phone, a personal digital assistant (e.g., a BLACKBERRY® device), a personal computer, automotive electronics, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as RAM, flash memory, or disk storage) stores one or more software applications 130 (e.g., embedded applications) that, when executed by the CPU 112, perform any suitable function associated with the computing device 100. The functions performed by the various components illustrated herein may be shared between the various components or performed entirely by different components and/or one or more processors executing code, such that the functions are not necessarily limited to being performed by any one illustrated component.

The tester 110 is a diagnostic system and comprises logic (embodied at least partially in hardware) that supports monitoring, testing, and debugging of the computing device 100 executing the software application 130. For example, the tester 110 can be used to emulate one or more defective or unavailable components of the computing device 100 to allow verification of how the component(s), were it actually present on the computing device 100, would perform in various situations (e.g., how the component(s) would interact with the software application 130). In this way, the software application 130 can be debugged in an environment which resembles post-production operation.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, and the like. The input is received using audio-visual inputs (using, for example, voice and/or facial recognition), and mechanical devices such as keypads, switches, proximity detectors, and the like. The CPU 112 and tester 110 is coupled to I/O (Input-Output) port 128, which provides an interface (that is configured to receive input from (and/or provide output to) peripherals and/or networked devices 131, including tangible media (such as flash memory) and/or cabled or wireless media (such as provided by a cellular telephone network). These and other input and output devices are selectively coupled to the computing device 100 by external devices using wireless or cabled connections.

Mobile device 129 is an example computing device 100 that is used to generate video streams. For example, video sensor 132 is arranged on the face of the mobile device 129 and is arranged to generate a video signal used for a video-telephone session. Likewise, a microphone is used to generate an audio signal used for the session. The video processor 134 receives the audio and video signals and generates a video stream using encoder 136. The video stream is coupled to the input/output (I/O) port 128 for transmission. The video stream is received by, for example, a second mobile device 132 that includes a decoder 131 that is arranged to decode the received video stream for playback. (The first and second mobile devices are arranged to communicate video in a full-duplex mode across a cellular network, for example.) Although the example computing device 100 is illustrated as being a video mobile device 129, other systems such as video recorders, video cameras, security systems, network appliances, and the like may include the encoder 136 as described herein.

In an embodiment, the encoder 136 is arranged to encode a video stream in accordance with the H.264 standard mentioned above. The video stream includes a series of pictures (e.g., frames or fields) wherein each picture is divided into a number of macro-blocks that is normally fixed. A picture can have one or more slices, wherein each slice includes a consecutive sequence of macro-blocks, wherein the length of the consecutive sequence is variable.

The H.264 video standard provides two different entropy coding modes for encoding the bit-stream: Context Adaptive Variable Length Coding (CAVLC) and Context Adaptive Binary Arithmetic Coding (CABAC). The entropy coding mode is normally selected at the beginning of picture encoding.

When the selected entropy coding mode is CAVLC, processing is performed without executing an actual macro-block loop. Thus, the encoder is able to encode the bit stream by transmitting a number of macro-blocks in the bit stream (e.g., video stream) to be skipped in a "skip run." Encoding the skip run is typically performed with a minimum of processing and thus achieves better (e.g., than CABAC) processing efficiencies, while encoding with CAVLC normally entails lesser bandwidth requirements as compared to encoding using CABAC.

When the selected entropy coding mode is CABAC, many variables affect the structure of the bit stream for a given skip picture of same resolution (e.g., the number of macro-blocks in the slice of a frame). Variables that affect the structure of the bit stream include the "picture type" (e.g., having one or else two frame-reference directions), "slice_qp" (e.g., quantization parameter for scaling transform coefficient levels), and "cabac_init_idc (e.g., an index for maintaining the state of an encoder)." Further, there is normally no direct relationship between the bit stream and the number of macro-blocks in the picture because of the nature of context adaptive probability based symbol encoding. Such factors greatly increase the difficulty of using skipping macro-blocks for frame skipping when CABAC is selected as the entropy coding mode.

Conventional solutions use a CABAC engine to encode macro-blocks in the picture as skip macro-blocks by executing at the level of the macro-block loop. In most higher-performance implementations of H264 encoders, the CABAC is accelerated using hardware accelerators. A hardware accelerator is normally required to load a relatively large amount of data to its internal memory before encoding a macro-block as a skip macro-block. Encoding macro-blocks as skip macro-blocks is conventionally performed for every macro-block in the picture and thus requires a significant amount of processing power to complete the encoding. A conventional hardware accelerator-based solution typically requires around 30 cycles to encode a macro-block, and thus encoding an HD (high definition) frame as a skip frame is conventionally performed in around 2.5 megacycles. Further drawbacks include the need for greater bandwidth to encode a skip frame, increased external memory accesses, and increased power requirements due to the clocking of the accelerator hardware.

In contrast, the present disclosure includes an efficient scheme for coding a picture using skip macro-blocks without having to execute time-consuming code at the macro-block loop level using CABAC in an H264 encoder. Normally CABAC works with context based probability tables that are initialized at a slice level. The initialization of the context table is performed in response to the variables "picture type," "slice_qp," and "cabac_init_idc." The variables slice_qp and cabac_init_idc are not typically used by external processes (e.g., external to CABAC) in the encoder. Thus, when a skipped picture is encoded as skipped macro-blocks, slice_qp and cabac_init_idc are initialized to convenient values (as described below) to ensure an efficient path through the encoder. In contrast, the variable picture type is used by other processes and is initialized (at least in part) as described below with reference to FIG. 2 and FIG. 3.

Figure 2:
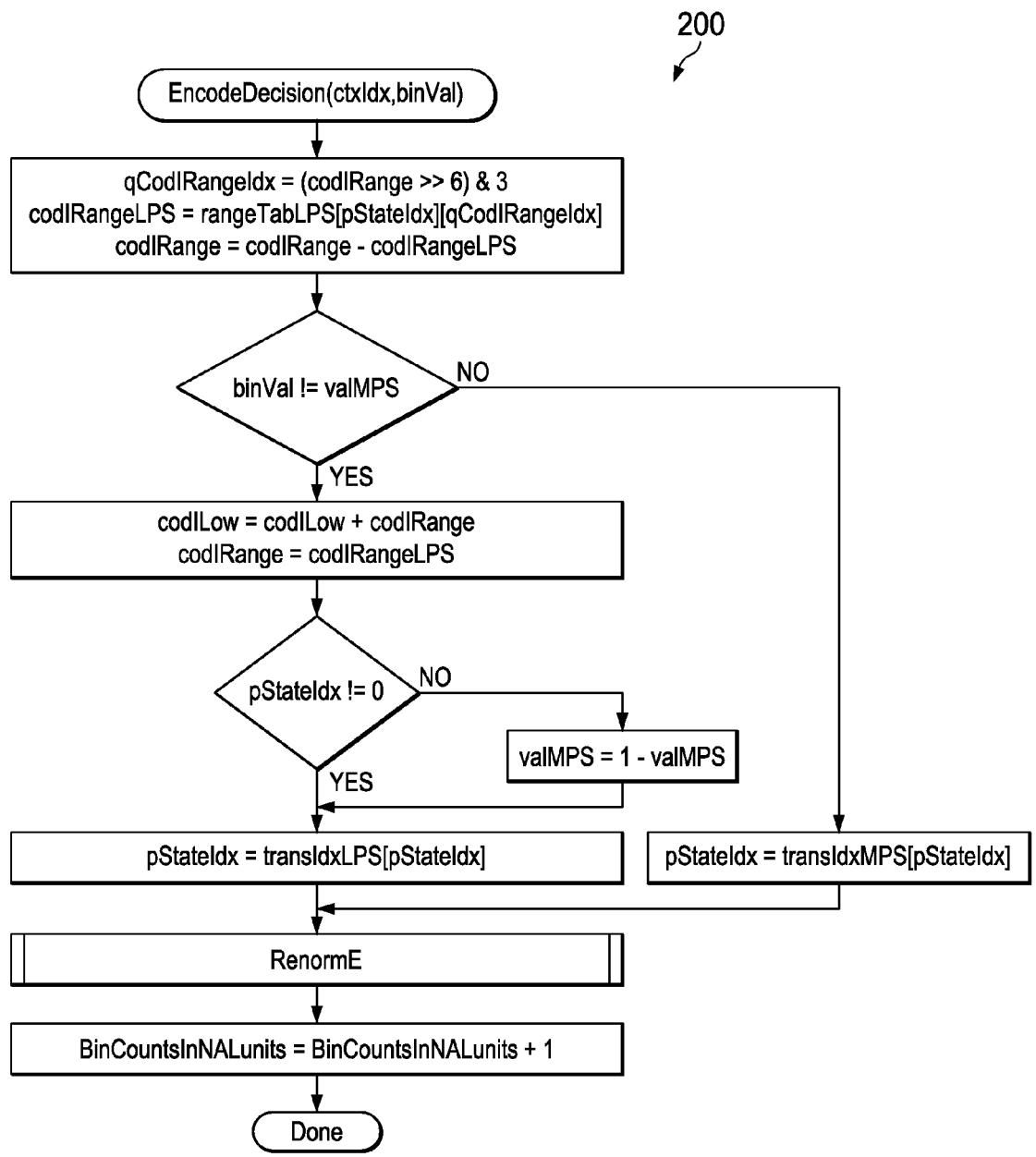
FIG. 2 is a flow diagram for encoding a decision in accordance with the H.264 standard.

FIG. 2 is a flow diagram for encoding a decision in accordance with the H.264 standard. Process 200 includes certain variables that are defined by the H.264 standard. For example, the process 200 receives a currently encoding bin, a context value, a range and low limit variable. The variable "binVal" is a bin value that is to be encoded as a zero or a one. The "ctxIdx" (context index) variable is an index for addressing the context table that is used for probability selection. The "codIRange" (code integer range) variable is initialized to 510 at start of processing a slice. The "codILow" (code integer low) variable is initialized to zero at start of processing the slice.

The process 200 determines the most probable symbol value and the state index from a context table and the range of the least probable symbol from a range table. The "pStateIdx" (probability state index) variable is the index used to determine the probability for the most probable symbol. The "valMPS" (value most probable symbol) is the value of most probable symbol. The "rangeTabLPS" (range table least probable symbol), "transIdxLPS" (translation index least probable symbol), and "transIdxMPS" (translation index most probable symbol) are lookup tables defined in the standard. The pStateIdx is updated using the transIdxMPS and the transIdxLPS tables. The process "RenormE" (renormalize) is used to update the codIRange and codILow values (e.g., when codIRange <256, the codIRange is doubled).

FIG. 3 is a context table illustrating regions of values of a most probable symbol as a function of the calculated value of pStateIdx in accordance with embodiments of the present disclosure. Context table 300 illustrates example calculated values of pStateIdx as a function of (e.g., all) possible values of picture type (P or B), cabac_init_idc (0, 1 and 2) and slice_qp (0-51). Row 330 illustrates example values of m and n as a function of a corresponding picture type and cabac_init_idc.

Context table 300 includes sub-table 310 and sub-table 320, where sub-table 310 illustrates example calculated values of pStateIdx as a function of picture type P, cabac_init_idc (0, 1 and 2) and slice_qp (0-51), and where sub-table 310 illustrates example calculated values of pStateIdx as a function of picture type B, cabac_init_idc (0, 1 and 2) and slice_qp (0-51). Each sub-table includes a column "m" and a column "n" that represent calculated values of pStateIdx in response to each of the three possible values of cabac_init_idc and slice_qp. Thus, for all possible values of cabac_init_idc and slice_qp, columns for m illustrate the preCtxState value after the pre-context state determination (first) step is calculated and the columns for n illustrate the pStateIdx value after the probability state index (second) step is calculated. Region 350 illustrates values for pStateIdx when valMPS is equal to one, while regions 340 illustrate values for pStateIdx when valMPS is equal to zero.

As disclosed herein, encoding an entire picture as skipped macro-blocks using the CABAC entropy coding mode normally begins with determining a reference type for each macro-block to be encoded. Each macro-block in the picture is encoded as "P-type" (predictive reference) macro-block skip or a "B-type" (bidirectional reference) macro-block skip. Two syntax elements ("mb_skip_flag" and "end_of_slice_flag") are used to code each macro-block. The end_of_slice_flag is not normally responsive to any context of the probability model and, instead, is used to as a flag as to when the codIRange variable is to be decremented by two (when the end_of_slice_flag=0) and when the CABAC encoding process is to be terminated (end_of_slice_flag=1). The mb_skip_flag is set to one for all macro-blocks in the skipped picture and uses the same probability "ctxIdx" (context index) for all macroblocks. For example the ctxIdx for a P-type macro-block skip is set to 11, whereas the ctxIdx for a B-type macro-block skip is set to 24. The pStateIdx value calculation for populating the context table in accordance with the corresponding ctxIdx is now explained below.

In a first step of calculating the pStateIdx for a macro-block skip, the variable "preCtxState" (pre-context state) is determined as follows in Eq. 1:

$$\text{preCtxState} = \text{Clip3}(1,126,((m*\text{Clip3}(0,51,\text{slice\_qp}))>>4)+n) \quad (1)$$

where the "m" and "n" values are defined by the H.264 in accordance with "cabac_init_idc" for each syntax element, and the function "Clip3" is defined by the H.264 standard. The Clip3 function effectively returns the value of X when Z is less than X, returns the value of Y when Z is greater than Y, or else otherwise returns the value of Z, where "X," "Y," and "Z" are the first, second and third input variables respectively of the Clip3 function.

In a second step of calculating the pStateIdx for a macro-block skip, the variables pStateIdx and valMPS are determined. When preCtxState is less than or equal to 63, StateIdx is assigned the result of 63 minus preCtxState and valMPS is assigned the value zero. When preCtxState is greater than 63, StateIdx is assigned the result of preCtxState minus 64 and valMPS is assigned the value one.

Context table 300 is used to simplify CABAC-type bin encoding. CABAC=type bin encoding is simplified, for example, when the b slice_qp and cabac_init_idc (for a given picture is being encoded) are selected such that the valMPS equals one. Selecting valMPS to be equal to one simplifies the encoding because the valMPS throughout the picture remains invariant as a function of the mb_skip_flag, which has the value of one for all the macro-blocks skipped in the picture (e.g., when the bin value is equal to one).

Because valMPS is equal to the bin value, the "yes" branch of process 200 is not taken and thus codILow is not modified from the initial value of zero. (The value of codILow is initialized to zero during the start of the slice encoding process in CABAC mode.) As explained below with respect to FIG. 5, codILow is modified (in the RenormE process) only when codILow is greater than 256. Because codILow is initialized to zero and is not modified during the encoding process, the RenormE process is simplified (as disclosed herein in FIG. 6 discussed below) for the portion of the renormalization process when codILow is less than 256.

Also, the RenormE process is simplified further (as disclosed herein in FIG. 7 discussed below) because the value of codIRange does not fall below 128 during the encoding of the mb_skip_flag and the end_pf_slice_flag. Thus, the renormalization process is simplified when the value of codILow is less than 256 and when the value of codiRange is greater than 12. The values of codILow are thus constrained by the judicious selection of slice_qp and cabac_init_idc as disclosed herein.

Accordingly, an efficient path through the CABAC encoding decision (and the RenormE process) base flowchart is selected in response to the judicious selection of slice_qp and cabac_init_idc.

Figure 4:
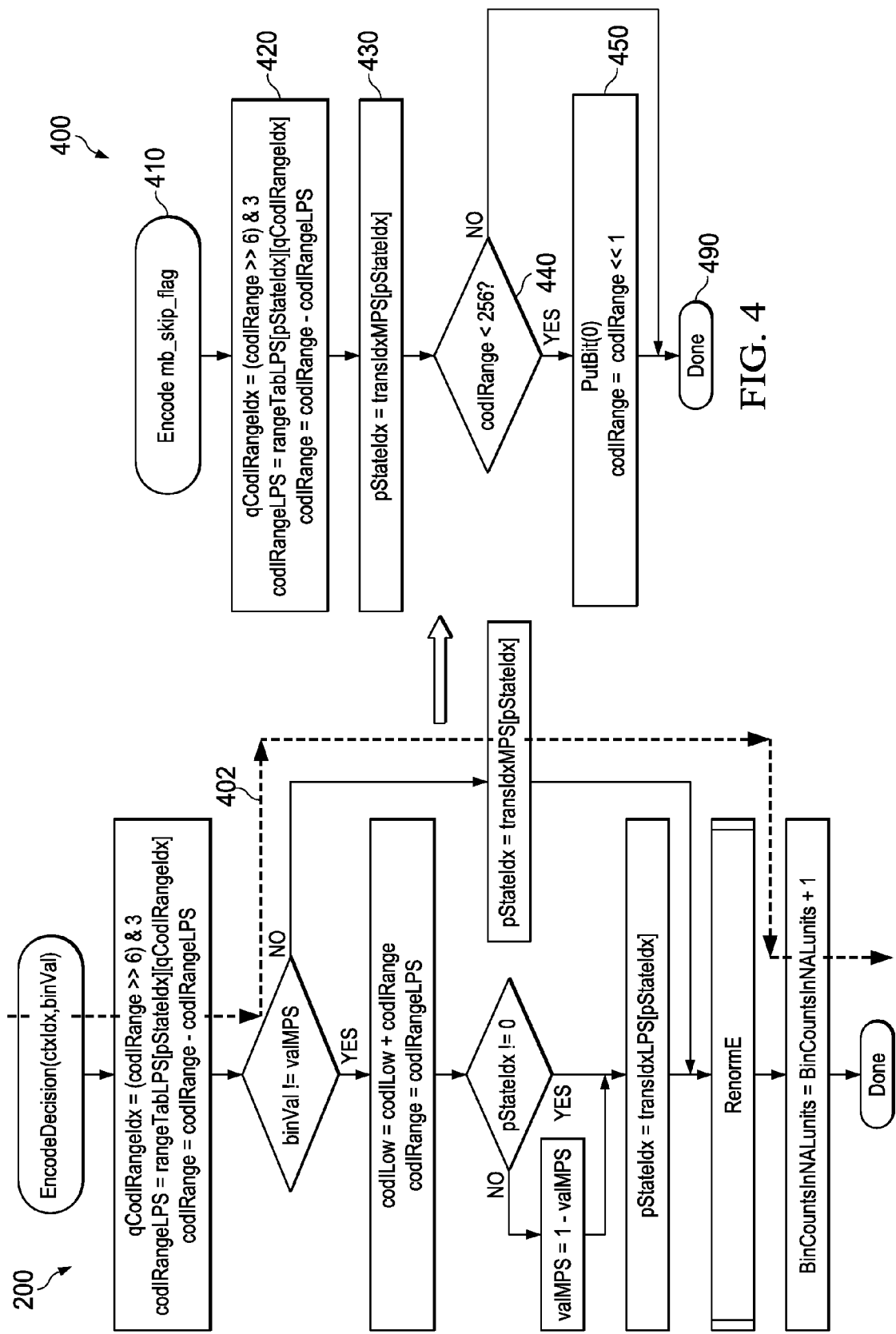
FIG. 4 illustrates a flow diagram for encoding a decision in skip macro-block processing in accordance with embodiments of the present disclosure.

FIG. 4 illustrates a flow diagram for encoding a decision in skip macro-block processing in accordance with embodiments of the present disclosure. Path 402 illustrates an efficient path through the CABAC encoding decision (and the RenormE) process 200 flow diagram that is taken in response to the judicious selection of slice_qp and cabac_init_idc (as disclosed herein). Process 400 illustrates a simplified process for encoding a decision that is (at least partially) derived from path 402.

At node 410, the process 400 to encode the mb_skip_flag is entered. The mb_skip_flag is set to one for all macro-blocks in the skipped picture and uses the same probability "ctxIdx" (context index) for all macroblocks. For example the ctxIdx for a P-macro-block skip is set to 11, whereas the ctxIdx for a B-macro-block skip is set to 24.

In operation 420, the values of variables qCodIRangeIdx, codIRangeLPS, and codIRange are modified as indicated.

In operation 430, the pStateIdx is modified as a function of transIdxMPS[pstateIdx] such that the new value of pStateIdx is one greater than the previous value unless pStateIdx is equal to 62 (wherein the TransIdxMPS[62] returns a value of 62) as discussed below with respect to Table 1 below:

TABLE 1

| pStateIdx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| transIdxLPS | 0 | 0 | 1 | 2 | 2 | 4 | 4 | 5 | 6 | 7 | 8 | 9 | 9 | 11 | 11 | 12 |
| transIdxMPS | 1 | 2 | 3 | 4 | 5 | 6 | 7 | 8 | 9 | 10 | 11 | 12 | 13 | 14 | 15 | 16 |
| pStateIdx | 16 | 17 | 18 | 19 | 20 | 21 | 22 | 23 | 24 | 25 | 26 | 27 | 28 | 29 | 30 | 31 |
| transIdxLPS | 13 | 13 | 15 | 15 | 16 | 16 | 18 | 18 | 19 | 19 | 21 | 21 | 22 | 22 | 23 | 24 |
| transIdxMPS | 17 | 18 | 19 | 20 | 21 | 22 | 23 | 24 | 25 | 26 | 27 | 28 | 29 | 30 | 31 | 32 |
| pStateIdx | 32 | 33 | 34 | 35 | 36 | 37 | 38 | 39 | 40 | 41 | 42 | 43 | 44 | 45 | 46 | 47 |
| transIdxLPS | 24 | 25 | 26 | 26 | 27 | 27 | 28 | 29 | 29 | 30 | 30 | 30 | 31 | 32 | 32 | 33 |
| transIdxMPS | 33 | 34 | 35 | 36 | 37 | 38 | 39 | 40 | 41 | 42 | 43 | 44 | 45 | 46 | 47 | 48 |
| pStateIdx | 48 | 49 | 50 | 51 | 52 | 53 | 54 | 55 | 56 | 57 | 58 | 59 | 60 | 61 | 62 | 63 |
| transIdxLPS | 33 | 33 | 34 | 34 | 35 | 35 | 35 | 36 | 36 | 36 | 37 | 37 | 37 | 38 | 38 | 63 |
| transIdxMPS | 49 | 50 | 51 | 52 | 53 | 54 | 55 | 56 | 57 | 58 | 59 | 60 | 61 | 62 | 62 | |

The Table 1 state transition table indicates that, when a macro-block is encoded as skip macro-block, the pStateIdx increases from a current value of the pStateIdx because the symbol being encoded is the most probable symbol. Thus the value pStateIdx is assigned the return value of the function transIdxMPS[pStateIdx] when the value of pState Idx is less than 62. When the value of pStateIdx is less than 62 during the skip flag encoding (with all the encountered symbols being the most probable symbol), the pStateIdx is incremented until the pStateIdx reaches a terminal value of 62 and remains unchanged while encoding further macro-blocks in the picture to be encoded. Thus the function transIdxMPS[62] returns a return value of 62.

In operation 440, the process flow proceeds to node 490 when the variable codIRange is not less than 256, or proceeds to operation 450 when the variable codIRange is less than 256. In operation 450, the process outputs a variable length word using PutBit(0) and by shifting the codIRange value by one bit position to the left (thus doubling the value as in the RenormE process of process 200). At node 490, the process ends.

The BinCountInNALunit modification process of process 200 that is implicated by path 402 is a counter process that is local to the encoder. Thus the BinCountInNALunit modification process for encoding any symbol in the encoder and is omitted from the process 400 to further simplify the process 400.

Figure 5:
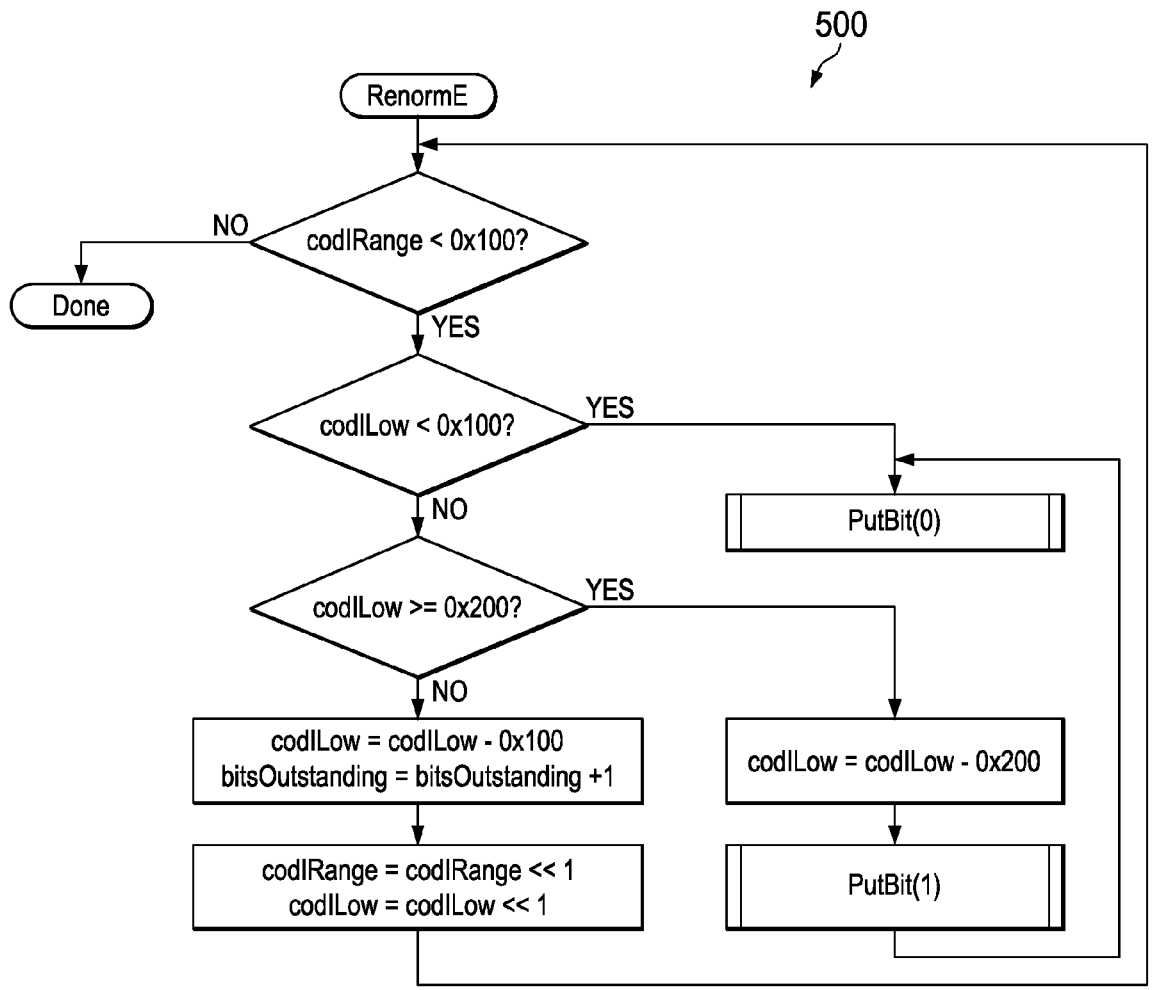
FIG. 5 is a flow diagram for a renormalization process in accordance with the H.264 standard.

FIG. 5 is a flow diagram for a renormalization process in accordance with the H.264 standard. Process 500 includes certain variables that are defined by the H.264 standard. For example, the process 200 modifies the range (codIRange) and the low limit (codILow) of the slice being encoded.

Figure 6:
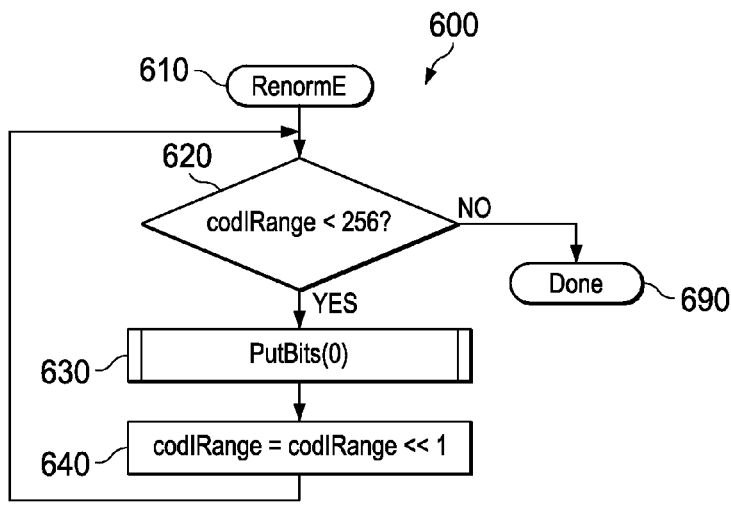
FIG. 6 illustrates a flow diagram for a skip macro-block renormalization process in accordance with embodiments of the present disclosure.

FIG. 6 illustrates a flow diagram for a skip macro-block renormalization process in accordance with embodiments of the present disclosure. Process 600 is entered at node 610 and proceeds to node 620 where process flow proceeds to operation 630 (PutBits(0)) when the variable codIRange is less than 256, or proceeds to node 690 when the variable codIRange is not less than 256. At operation 630 the process outputs a variable length word using PutBit(0) and proceeds to operation 640, where the codIRange value is shifted by one bit position to the left. After the codIRange value has been shifted, the process flow returns to operation 620. The process flow thus executes a loop that includes operations 620, 630, and 640 until when in operation 620, the variable codIRange is not less than 256, and the process flow proceeds to node 690 where the process exits.

Figure 7:
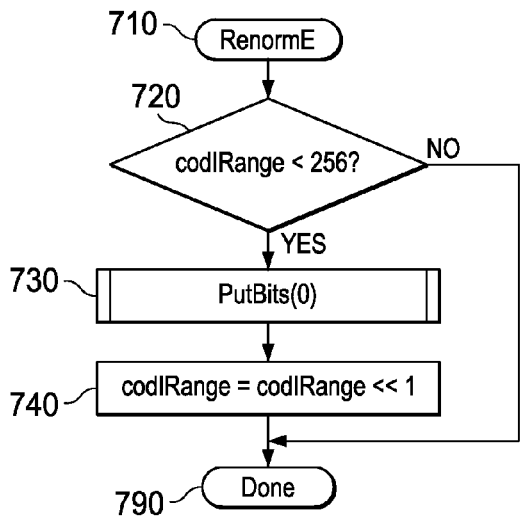
FIG. 7 illustrates a flow diagram for an optimized skip macro-block renormalization process in accordance with embodiments of the present disclosure.

FIG. 7 illustrates a flow diagram for an optimized skip macro-block renormalization process in accordance with embodiments of the present disclosure. Process 600 is simplified further by omitting the loop that includes operations 620, 630, and 640. The loop can be omitted because the value of codIRange does not fall below 128 during the encoding of the mb_skip_flag and the end_pf_slice_flag. Thus, the renormalization process is simplified when the value of codILow is less than 256 and when the value of codiRange is greater than 12.

Process 700 is entered at node 710 and proceeds to node 720 where process flow proceeds to operation 730 (PutBits (0)) when the variable codIRange is less than 256, or proceeds to node 790 when the variable codIRange is not less than 256. At operation 730 the process outputs a variable length word using PutBit(0) and proceeds to operation 740, where the codIRange value is shifted by one bit position to the left. After the codIRange value has been shifted, the process flow proceeds to node 790 where the process exits. Accordingly, the loop from process 600 has been omitted and the process 700 executes more efficiently.

Figure 8:
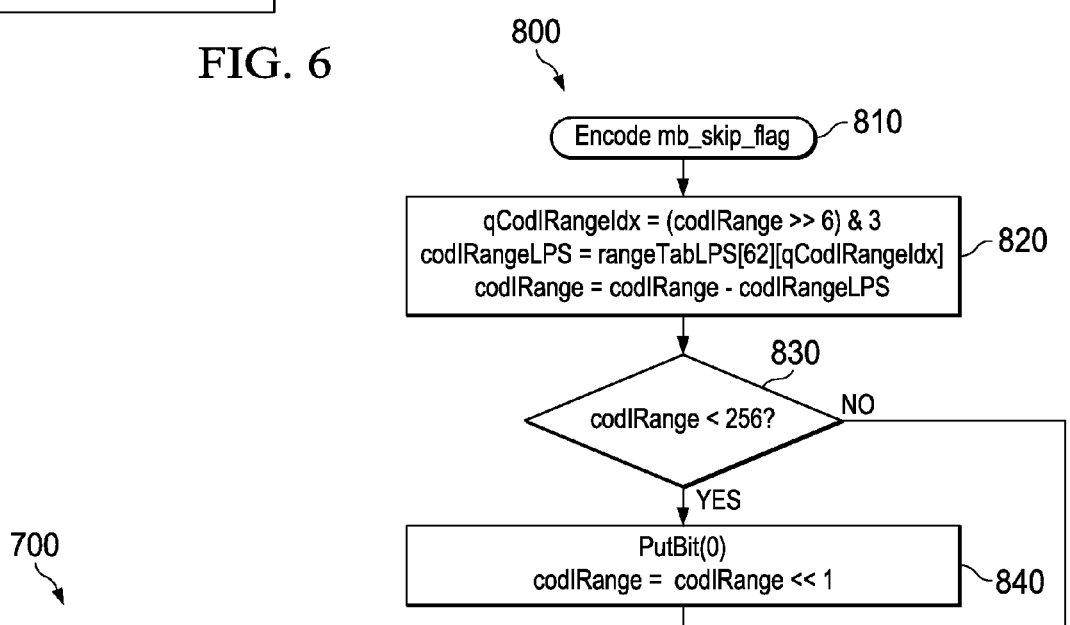
FIG. 8 illustrates a flow diagram for encoding a decision in skip macro-block processing in accordance with embodiments of the present disclosure.

FIG. 8 illustrates a flow diagram for encoding a decision in skip macro-block processing in accordance with embodiments of the present disclosure. Process 400 is simplified further by removing the derivation process of pStateIdx and replacing all instances of pStateIdx with the value of 62. For example, operations 810, 820, 830, and 840 are similar to operations 410, 420, 440, and 450, respectively, although operation 430 has been omitted and the instances of pStateIdx have been assigned the value 62. Accordingly, the process of encoding a decision in skip macro-block processing using CABAC is executed more efficiently.

Figure 9:
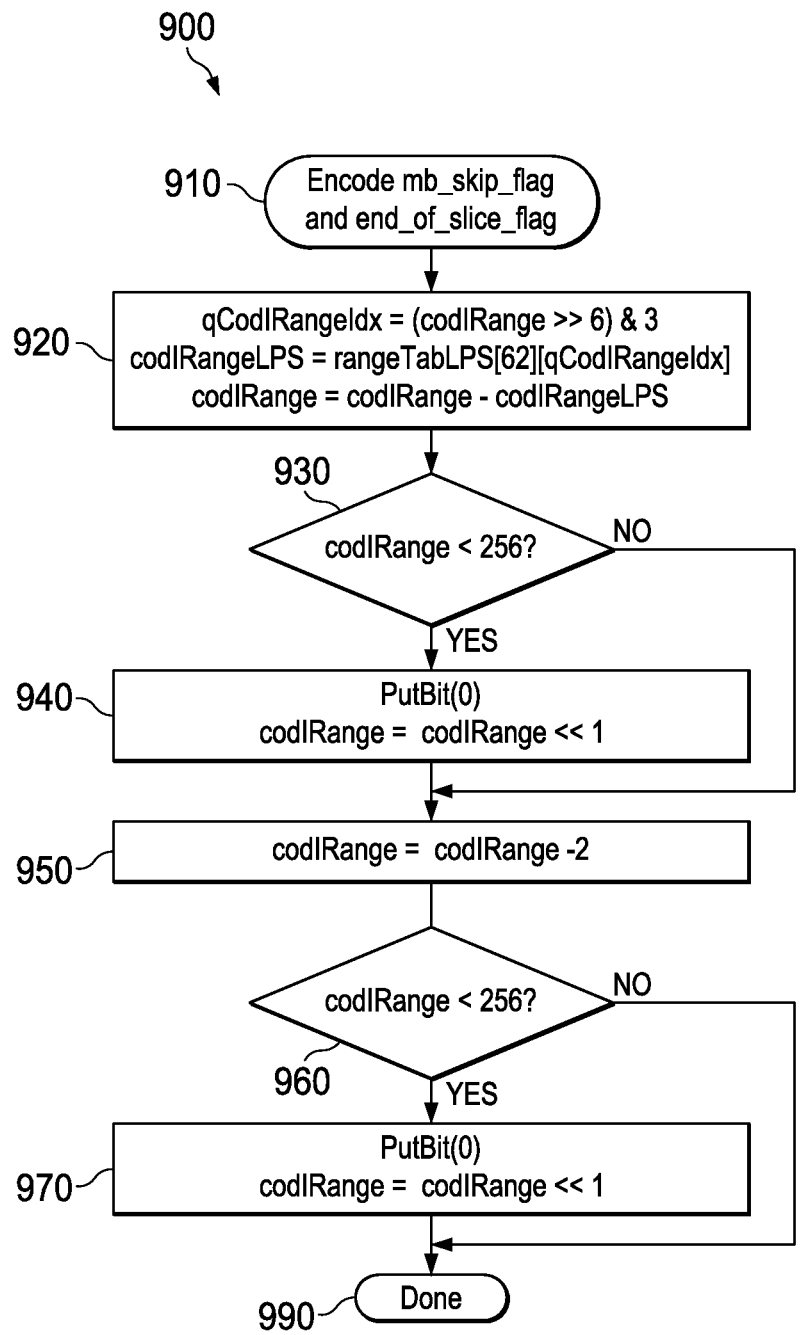
FIG. 9 illustrates a flow diagram for encoding a decision in skip macro-block processing in accordance with embodiments of the present disclosure.

FIG. 9 illustrates a flow diagram for encoding a decision in skip macro-block processing in accordance with embodiments of the present disclosure. Process 900 is a simplified process for encoding the mb_skip_flag as a one and encoding the end_of_slice flag as zero using CABAC. (Process 900 is simplified, for example, with respect to the section 9.3.4.5 of the H.264 standard entitled "Encoding process for a binary decision before termination.")

At node 910, the process 900 to encode the mb_skip_flag and the end_of_slice_flag is entered. In operation 920, the process of encoding the mb_skip_flag is initiated by modifying the values of variables qCodIRangeIdx, codIRangeLPS, and codIRange as indicated, with the rangeTabLPS function operating in accordance with Table 2, shown below.

In operation 930, the process flow proceeds to operation 950 when the variable codIRange is not less than 256, or proceeds to operation 940 when the variable codIRange is less than 256. In operation 940, the process outputs a variable length word using PutBit(0) and by shifting the codIRange value by one bit position to the left. In operation 950, the processing for encoding the end_of_slice flag decrements the value of codIRange is decremented by two. At node 490, the process ends.

In operation 960, the process flow proceeds to node 990 when the variable codIRange is not less than 256, or proceeds to operation 970 when the variable codIRange is less than 256. In operation 970, the process outputs a variable length word using PutBit(0) and by shifting the codIRange value by one bit position to the left. At node 490, the process ends.

As indicated by the skip macro-block encoding flow diagram shown in FIG. 9, the sole variable used in encoding the picture using skip macro-blocks is the codIRange variable. After the pStateIdx variable reaches saturation (62), the qCodIRangeIdx can have four values (zero, one, two, and three) in response to the value of codIRange at the start of every macro-block encoding. The qCodIRangeIdx four values (zero, one, two, and three) respectively correspond to the four possible codIRangeLPS values (six, seven, eight, and nine).

The maximum value that the codIRange can be assigned is 510. When the value of codIRange is 510 (and when the value of pStateIdx is equal to 62), the value of codIRange is modified as follows when encoding 26 macro-blocks using CABAC. The value for codIRangeLPS for encoding 26 macro-blocks is 195, which is the sum of all values in the codIRangeLPS column in Table 2 (shown below), which shows the state transitions of codIRange for 27 macro-blocks when pStateIdx is saturated. The range modification for end_of_slice_flag encoding is 26 times two, which equals 52. Thus, the value of codIRange (for encoding 26 macro-blocks) is determined by the maximum value of codIRange minus codIRangeLPS (for encoding 26 mb_skip_flags) minus the range modification for end_of_slice_flag encoding (510−195−52), which equals 263.

While encoding the 27th macro-block, the skip flag, the end of slice flag, and the codIRange are modified accordingly. The skip flag encoding uses the codIRange value minus the codIRange value (263−6), which is 257. The end_of_slice_flag encoding uses the: skip flag encoding minus two (257−2), which is 255. Thus, codIRange is less than 256→codIRange=255<<1 and putBit(0)→codIRange=510.

Accordingly, the simplified CABAC skip macro-block encoding is a periodic function. For example, after encoding 27 macro-blocks as skip macro-blocks, the simplified CABAC skip macro-block encoding function writes a bit (0) into the bit stream and returns to the same state as when the encoding for first macro-block is initiated.

Table 2 is a table indicating the state transition of codIRange for 27 macro-blocks when pStateIdx is saturated:

TABLE 2

| MBsCount | codeRange | pStateIdx | qCodIRangeIdx | codIRangeLPS |
|---|---|---|---|---|
| 0 | 510 | 62 | 3 | 9 |
| 1 | 499 | 62 | 3 | 9 |
| 2 | 488 | 62 | 3 | 9 |
| 3 | 477 | 62 | 3 | 9 |
| 4 | 466 | 62 | 3 | 9 |
| 5 | 455 | 62 | 3 | 9 |
| 6 | 444 | 62 | 2 | 8 |
| 7 | 434 | 62 | 2 | 8 |
| 8 | 424 | 62 | 2 | 8 |
| 9 | 414 | 62 | 2 | 8 |
| 10 | 404 | 62 | 2 | 8 |
| 11 | 394 | 62 | 2 | 8 |
| 12 | 384 | 62 | 2 | 8 |
| 13 | 374 | 62 | 1 | 7 |
| 14 | 365 | 62 | 1 | 7 |
| 15 | 356 | 62 | 1 | 7 |
| 16 | 347 | 62 | 1 | 7 |
| 17 | 338 | 62 | 1 | 7 |
| 18 | 329 | 62 | 1 | 7 |
| 19 | 320 | 62 | 1 | 7 |
| 20 | 311 | 62 | 0 | 6 |
| 21 | 303 | 62 | 0 | 6 |
| 22 | 295 | 62 | 0 | 6 |
| 23 | 287 | 62 | 0 | 6 |
| 24 | 279 | 62 | 0 | 6 |
| 25 | 271 | 62 | 0 | 6 |
| 26 | 263 | 62 | 0 | 6 |
| 27 | 510 | 62 | 3 | 9 |

With reference to the context table 300 (which provides permissible values for pStateIdx), there is no initial combination of slice_qp and cabac_init_idc that has pStateIdx being equal to the value 62 at start of the slice initialization. However, in execution the periodic state of CABAC for skip macro-block encoding (as illustrated in Table 2 which illustrates state transitions of codIRange for 27 macro-blocks when pStateIdx is saturated) is achieved after encoding a relatively few skip macro-blocks when using judiciously selected values for slice_qp and cabac_init_idc.

For example, the variable pStateIdx is initialized to 33 at start of slice in response to the values for slice_qp and cabac_init_idc being selected as below for P-type and B-type pictures. For P-type pictures, slice_qp is initialized to 45 and cabac_init_idc is initialized to the value zero. For B-type pictures, slice_qp is initialized to 30 and cabac_init_idc is initialized to the value zero. In response to these settings, the simplified CABAC skip macro-block encoding function is able to reach the periodic state after encoding 47 skip macro-blocks.

Table 3 illustrates progressive values for codIRange and pStateIdx transitions when pStateIdx is initialized to the value 33 at the start of slice processing:

TABLE 3

| MBsCount | codeRange | pStateIdx | qCodIRangeIdx | codIRangeLPS | Bit Count |
|---|---|---|---|---|---|
| 0 | 510 | 33 | 3 | 43 | 0 |
| 1 | 465 | 34 | 3 | 41 | 0 |
| 2 | 422 | 35 | 2 | 33 | 0 |
| 3 | 387 | 36 | 2 | 32 | 0 |
| 4 | 353 | 37 | 1 | 26 | 0 |
| 5 | 325 | 38 | 1 | 24 | 0 |
| 6 | 299 | 39 | 0 | 19 | 0 |
| 7 | 278 | 40 | 0 | 18 | 0 |
| 8 | 258 | 41 | 0 | 17 | 0 |

TABLE 3-continued

| MBsCount | codeRange | pStateIdx | qCodIRangeIdx | codIRangeLPS | Bit Count |
|---|---|---|---|---|---|
| 9 | 480 | 42 | 3 | 27 | 1 |
| 10 | 451 | 43 | 3 | 25 | 1 |
| 11 | 424 | 44 | 2 | 21 | 1 |
| 12 | 401 | 45 | 2 | 20 | 1 |
| 13 | 379 | 46 | 1 | 16 | 1 |
| 14 | 361 | 47 | 1 | 15 | 1 |
| 15 | 344 | 48 | 1 | 14 | 1 |
| 16 | 328 | 49 | 1 | 14 | 1 |
| 17 | 312 | 50 | 0 | 11 | 1 |
| 18 | 299 | 51 | 0 | 10 | 1 |
| 19 | 287 | 52 | 0 | 10 | 1 |
| 20 | 275 | 53 | 0 | 9 | 1 |
| 21 | 264 | 54 | 0 | 9 | 1 |
| 22 | 508 | 55 | 3 | 14 | 2 |
| 23 | 492 | 56 | 3 | 13 | 2 |
| 24 | 477 | 57 | 3 | 12 | 2 |
| 25 | 463 | 58 | 3 | 12 | 2 |
| 26 | 449 | 59 | 3 | 11 | 2 |
| 27 | 436 | 60 | 2 | 9 | 2 |
| 28 | 425 | 61 | 2 | 9 | 2 |
| 29 | 414 | 62 | 2 | 8 | 2 |
| 30 | 404 | 62 | 2 | 8 | 2 |
| 31 | 394 | 62 | 2 | 8 | 2 |
| 32 | 384 | 62 | 2 | 8 | 2 |
| 33 | 374 | 62 | 1 | 7 | 2 |
| 34 | 365 | 62 | 1 | 7 | 2 |
| 35 | 356 | 62 | 1 | 7 | 2 |
| 36 | 347 | 62 | 1 | 7 | 2 |
| 37 | 338 | 62 | 1 | 7 | 2 |
| 38 | 329 | 62 | 1 | 7 | 2 |
| 39 | 320 | 62 | 1 | 7 | 2 |
| 40 | 311 | 62 | 0 | 6 | 2 |
| 41 | 303 | 62 | 0 | 6 | 2 |
| 42 | 295 | 62 | 0 | 6 | 2 |
| 43 | 287 | 62 | 0 | 6 | 2 |
| 44 | 279 | 62 | 0 | 6 | 2 |
| 45 | 271 | 62 | 0 | 6 | 2 |
| 46 | 263 | 62 | 0 | 6 | 2 |
| 47 | 510 | 62 | 3 | 9 | 3 |

Table 3 indicates the progressions of codIRange and pStateIdx (with pStateIdx being assigned the value 33) at the slice start. The progressions indicate that for first few macro-blocks (47 macro-blocks in this example) the bit stream has a nonlinear relationship with the number of macro-blocks. After reaching the periodic state, the bits encoded have a linear relationship with the number of macro-blocks that needs to be encoded. The relationship between the bit stream and number of macro-blocks is expressed as follows:

NumOfZeros=NumBitsBeforeSaturation+((PicSizeIn-Mbs−Num_SkipMBs_Before_Saturation)/27);

putBits(NumOfZeros);

where Num_Bits_Before_Saturation is the number of bits in the bit stream before saturation, PicSizeInMbs is equal to the total number of macro-blocks in the current picture being skipped, Num_SkipMBs_Before_Saturation is the number of skipped macro-blocks in the bit stream before saturation, and NumOfZeros is the number of zeros to be output by the putBit function.

Figure 10:
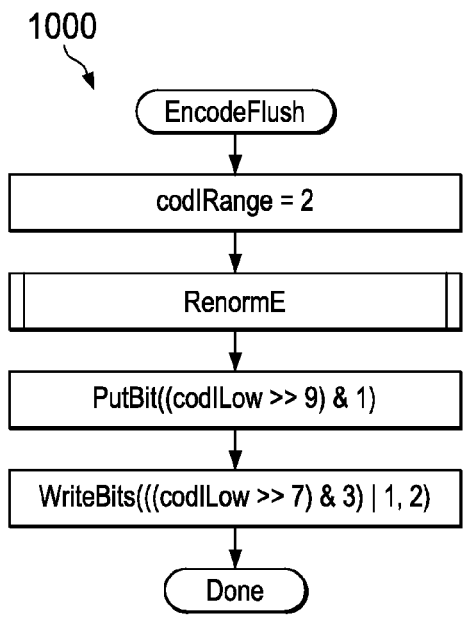
FIG. 10 is a flow diagram for flushing at termination in accordance with the H.264 standard.

For the above example case where the value of pStateIdx is equal to the value 33, Table 3 indicates the value of Num_Bits_Before_Saturation is equal to 3 and that the value of Num_SkipMBs_Before_Saturation is equal to 47. Thus the value of NumOfZeros to be output is determined as follows:

NumOfZeros=3+((PicSizeInMbs−47)/27);

putBits(NumOfZeros);

FIG. 10 is a flow diagram for flushing at termination in accordance with the H.264 standard. At end of the last the macro-block (at the end of the picture and end of the slice to be encoded), the EncodeFlush process is executed for proper termination of CABAC engine.

In accordance with the instant disclosure, end patterns are written in response to the 27 possible values of "codIRange," which here is a controlling variable. From Table 1, it is clear that the codIRange has 27 possible values after encoding a skip macro-block after reaching the periodic state. Thus, an efficiently executable EncodeFlush process as disclosed herein generates 27 different bit strings, which are stored in a lookup table in an embodiment. The lookup table is sequentially accessed to select each of the 27 different end patterns for writing to the bit stream at end of the picture and/or slice. Thus the disclosed EncodeFlush process can avoid the process intensive RenormE process of the conventional Encode-Flush process 1000. In an embodiment a table for the disclosed EncodeFlush process is illustrated as follows:

```
endPattern[27] =
{
  0xFE ,0xF3 ,0xE9 ,0xDD ,0xD3 ,0xC7 ,0xBD ,
  0xB3 ,0xa9 ,0x9f ,0x95 ,0x8B ,0x81 ,0x77 ,
  0x6D ,0x65 ,0x5B ,0x53 ,0x49 ,0x41 ,0x37 ,
  0x2F ,0x27 ,0x1F ,0x17 ,0x0F ,0x07
};
```

For the example case, where the value of pStateIdx is equal to the value 33, the bit stream for the 47 encoded macro-blocks is represented as follows:

```
bitStreamBeforeSaturation[47] =
{
  0xe880,0xd380,0xc180,0xb080,0xa280,0x9580,0x8b80,0x8180,
  0x7840,0x70c0,0x6a40,0x6440,0x5ec0,0x5a40,0x5640,0x5240,
  0x4e40,0x4ac0,0x47c0,0x44c0,0x44c0,0x44c0,0x3da0,0x3ba0,
  0x39e0,0x3820,0x36a0,0x3520,0x33e0,0x32a0,0x3160,0x3020,
  0x2ee0,0x2da0,0x2ca0,0x2b60,0x2a60,0x2920,0x2820,0x26e0,
  0x25e0,0x24e0,0x23e0,0x22e0,0x21e0,0x20e0
};
```

Figure 11:
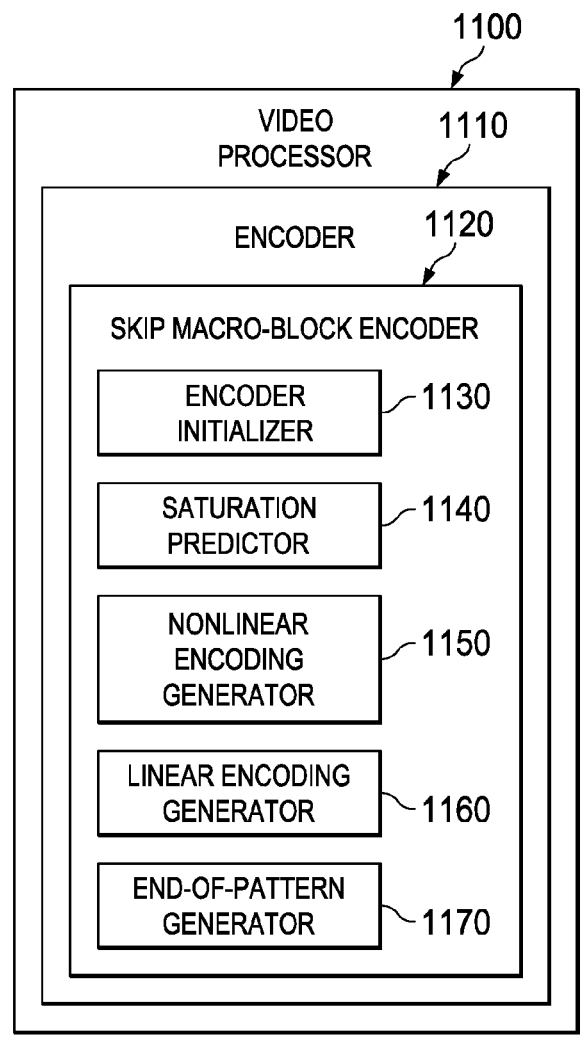
FIG. 11 illustrates a schematic diagram for skip macro-block generator in accordance with embodiments of the present disclosure.

FIG. 11 illustrates a schematic diagram for skip macro-block generator in accordance with embodiments of the present disclosure. Video processor 1100 is a video processor such as video processor 134, and includes an encoder 1110 such as encoder 136. Encoder 1110 includes a skip macro-block encoder 1120 and is arranged to produce efficiently encoded skip macro-blocks, for example, to reduce bandwidth and processing requirements encountered when producing skip frames when encoding a picture for a video bit stream. The functions performed by the various illustrated components may be shared between the various components or performed entirely by different components and/or processors executing code, such that the functions are not necessarily limited to being performed by any one illustrated component.

Skip macro-block encoder 1120 includes an encoder initializer 1130 that is arranged to initialize and determine encoder variables (such as the variables described above) in response to a determination to provide skip macro-block encoding at the start of processing a slice. The determination is received by the skip macro-block encoder 1120, or is generated by the skip macro-block encoder 120 in response to environmental variables such as power consumption, processor utilization, and bandwidth availability. More particularly, encoder initializer 1130 judiciously selects values for the above-discussed variables slice_qp and cabac_init_idc (in accordance with context table 300, for example) that are consistent with the variable valMPS being assigned a value of one at the start of slice processing.

Skip macro-block encoder 1120 includes a saturation predictor 1140 that is arranged to determine a transitional location in a bit stream that includes skip macro-block encoding, where the transitional location provides an indication where a linear relationship starts to exist between a length of the encoded bit stream and a length of a number of skipped macro-blocks while the slice is being processed. More particularly, saturation predictor 1140 determines the number of skipped macro-blocks (such as the Num_SkipMBs_Before_Saturation discussed above) that needs to be encoded to reach the periodic state (e.g., where the linear relationship starts to exist). Saturation predictor 1140 also is arranged to determine whether the periodic state is reachable before the end of slice processing is encountered.

Skip macro-block encoder 1120 includes a nonlinear encoding generator 1150 that is arranged to encode skipped macro-blocks in the bit stream using a lookup table such as illustrated by Table 3 above. The lookup table includes predetermined values so as to quickly produce or calculate looked-up values (as compared with calculating the looked-up values during the encoding process) for encoding skipped macro-blocks that have a length that is non-linear with the length of the bit stream to be encoded. When it is determined the end of slice encoding would occur before reaching the periodic state (such as when the picture size in macro-blocks is less than the number of skip macro-blocks before saturation), the bit stream length has a nonlinear relationship to the length of the number of macro-blocks to be skip encoded. Accordingly, the bit stream is encoded using nonlinear values (from, for example, a lookup table). Thus, nonlinear encoding generator 1150 determines the values for encoding skipped macro-blocks to be output before the linear relationship starts to exist when processing a slice.

Skip macro-block encoder 1120 includes a linear encoding generator 1160 that is arranged to encode skipped macro-blocks in the bit stream using a linear relationship between the bits to be encoded and the number of macro-blocks that needs to be encoded. When it is determined the end of slice encoding would not occur before reaching the periodic state (such as when the picture size in macro-blocks is not less than the number of skip macro-blocks before saturation), the bit stream length has a linear relationship to the length of the number of macro-blocks to be skip encoded. Accordingly, the bit stream is encoded using linear values that are determined from, for example, a numerical relationship between the number of bits to be encoded and the number of macro-blocks that needs to be encoded. Thus, the output bit stream can be determined by using the "number of zeros" calculation discussed above with respect to Table 3.

Skip macro-block encoder 1120 includes an end-of-pattern generator 1170 that is arranged to generate the end pattern using a lookup table such as discussed above with respect to the disclosed Encode Flush process. In an embodiment, a lookup table is generated for each case of the (e.g., relatively few) possible values of the variable codIRange. Thus, the end-of-pattern generator process generates different end patterns for writing to the bit stream at end of the picture and/or slice in accordance with the proper termination of a CABAC engine.

The functions of the disclosed skip macro-block generator may be expressed as follows:

```
if(PicSizeInMbs >= Num_SkipMBs_Before_Saturation)
{
  NumOfZeros = Num_SkipMBs_Before_Saturation +
    ((PicSizeInMbs- Num_SkipMBs_Before_Saturation) / 27);
  putBits (NumOfZeros);
  putBits (endPattern[(PicSizeInMbs-
    Num_SkipMBs_Before_Saturation) % 27]);
  Encode_rbsp_trailing_bits ( );
}
else
{
    putBits(bitStreamBeforeSaturation[PicSizeInMbs−1]);
}
``` where the function "Encode_rbsp_trailing_bits" is arranged to generate different end patterns for writing to the bit stream at end of the picture in accordance with proper termination of a CABAC engine.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A skip macro-block encoder, comprising
   a saturation predictor that is arranged to determine a transitional location in a bit stream that includes skip macro-block encoding, wherein the transitional location provides an indication where a linear relationship starts to exist between a length of the encoded bit stream and a length of a number of skipped macro-blocks, wherein skip macro-block coding skip frames by setting a flag of all in macro blocks in CABAC;
   an end-of-pattern generator for generating end patterns for writing to the bit stream at end of the slice processing in accordance with the proper termination of a CABAC engine;
   a nonlinear encoding generator that is arranged to encode skipped macro-blocks in the bit stream before the transitional location using a nonlinear relationship between the length of the encoded bit stream and the length of the number of skipped macro-blocks; and
   a linear encoding generator that is arranged to encode skipped macro-blocks in the bit stream using a linear relationship between the length of the encoded bit stream and the length of the number of skipped macro-blocks.

2. The encoder of claim 1, wherein the saturation predictor is arranged to determine a transitional location in a slice of a bit stream of a picture.

3. The encoder of claim 1, wherein the nonlinear relationship is a predetermined nonlinear relationship is stored in a lookup table.

4. The encoder of claim 1, wherein the linear relationship is determined using the number of bits to be encoded for the bit stream and the number of skipped macro-blocks that needs to be encoded.

5. The encoder of claim 4, wherein the linear relationship is determined during encoding of the bit stream.

6. The encoder of claim 1, comprising an encoder initializer that is arranged to initialize and determine encoder variables in response to a determination to provide skip macro-block encoding at the start of processing a slice.

7. The encoder of claim 6, wherein the determined encoder variables are H.264 slice_qp and cabac_init_idc variables.

8. The encoder of claim 1, wherein the slice_qp and cabac_init_idc variables are determined by selecting values of slice_qp and cabac_init_idc for which a value of one is obtained for the value of the most probable symbol value.

9. The encoder of claim 1, wherein the encoder is arranged to encode symbols using a Context Adaptive Binary Arithmetic Coding (CABAC) entropy encoding.

10. The encoder of claim 1, wherein the transitional location is determined evaluating a saturation condition of a state index of a state transition table for determining the most probable symbol.

11. A video system, comprising:
A video processor that is arranged to receive a video signal that is to be compressed; and
An encoder that is arranged to skip frames of the video signal by using skip macro-block encoding by generating a compressed bit stream in response to the received video signal, the bit stream having a transitional location that is determined by the encoder, wherein the transitional location provides an indication where a linear relationship starts to exist between a length of the encoded bit stream and a length of a number of skipped macro-blocks, wherein skipped macro-blocks in the bit stream that are located before the transitional location are generated using a nonlinear relationship between the length of the encoded bit stream and the length of the number of skipped macro-blocks, and wherein skipped macro-blocks in the bit stream that are located after the transitional location are generated using a linear relationship that exists between the length of the encoded bit stream and the length of the number of skipped macro-blocks, wherein comprises an end-of-pattern generator for generating end patterns for writing to the bit stream at end of the slice processing in accordance with the proper termination of a CABAC engine.

12. The system of claim 11 wherein the video system comprises a decoder that is arranged to decode a video stream that includes the compressed bit stream generated using skip macro-block encoding.

13. The system of claim 11 wherein video system comprises a memory storage that is arranged to record a video stream that includes the compressed bit stream generated using skip macro-block encoding.

14. The system of claim 11, wherein the nonlinear relationship is a predetermined nonlinear relationship.

15. A method for monitoring the execution of a safety-related processor, comprising:
determining a transitional location in a bit stream that includes skip macro-block encoding, wherein the transitional location provides an indication where a linear relationship starts to exist between a length of the encoded bit stream and a length of a number of skipped macro-blocks, wherein skip macro-block coding skip frames by setting a flag of all in macro blocks in CABAC, and an indication of end-of-pattern for writing to the bit stream at end of the slice processing in accordance with the proper termination of a CABAC engine;
encoding skipped macro-blocks in the bit stream before the transitional location using a nonlinear relationship between the length of the encoded bit stream and the length of the number of skipped macro-blocks; and
encoding skipped macro-blocks in the bit stream using a linear relationship between the length of the encoded bit stream and the length of the number of skipped macro-blocks.

16. The method of claim 15, comprising decoding a video stream that includes the compressed bit stream generated using skip macro-block encoding.

17. The method of claim 16, comprising recording a video stream that includes the compressed bit stream generated using skip macro-block encoding.

18. The method of claim 16, wherein the nonlinear relationship is a predetermined nonlinear relationship.

19. The method of claim 18, comprising encoding symbols using a Context Adaptive Binary Arithmetic Coding (CABAC) entropy encoding, wherein the slice_qp and cabac_ init_idc variables are determined by selecting values of slice_qp and cabac_init_idc for which a value of one is obtained for the value of the most probable symbol value.

* * * * *